US005187333A

United States Patent [19]

Adair

[11] Patent Number: 5,187,333

[45] Date of Patent: Feb. 16, 1993

[54] COILED EXPONENTIAL BASS/MIDRANGE/HIGH FREQUENCY HORN LOUDSPEAKER

[76] Inventor: John F. Adair, 147 Norwood St., Shreveport, La. 71105

[21] Appl. No.: 620,726

[22] Filed: Dec. 3, 1990

[51] Int. Cl.[5] .............................. H05K 5/00

[52] U.S. Cl. .............................. 181/152; 181/155; 181/156; 181/159; 181/192; 181/199

[58] Field of Search .............. 181/144, 145, 148, 152, 181/153, 155, 156, 159, 192, 193, 194, 199; 381/156; D14/30

[56] References Cited

U.S. PATENT DOCUMENTS

| | | | |
|---|---|---|---|
| 3,944,757 | 3/1976 | Tsukamoto | 181/152 |
| 4,100,371 | 7/1978 | Bayliff | 181/144 X |
| 4,790,408 | 12/1988 | Adair | 181/152 |
| 4,930,596 | 6/1990 | Saiki et al. | 181/152 |

*Primary Examiner*—Michael L. Gellner

*Assistant Examiner*—Khanh Dang

*Attorney, Agent, or Firm*—John M. Harrison

[57] ABSTRACT

Coiled exponential bass/midrange/high frequency horn loudspeakers which are characterized by a rigid cabinet of selected size having a sealed air chamber in the base thereof for receiving a low frequency speaker, or driver, a coiled or convoluted, exponentially flared sound passage extending from the air chamber to the top of the cabinet and a high frequency horn mounted in the cabinet near the open top to extend the audio range of the loudspeaker system, which high frequency horn is attached to a corresponding high frequency driver by means of a time adjustable acoustic delay line. The combination of a high frequency acoustically delayed horn and a low frequency driver separated by a continuously exponentially expanding or flared, coiled or convoluted, multi-tapered sound passage chamber, enables the sound waves from both horns to exit the cabinet at substantially the same time.

9 Claims, 2 Drawing Sheets

FIG. 1
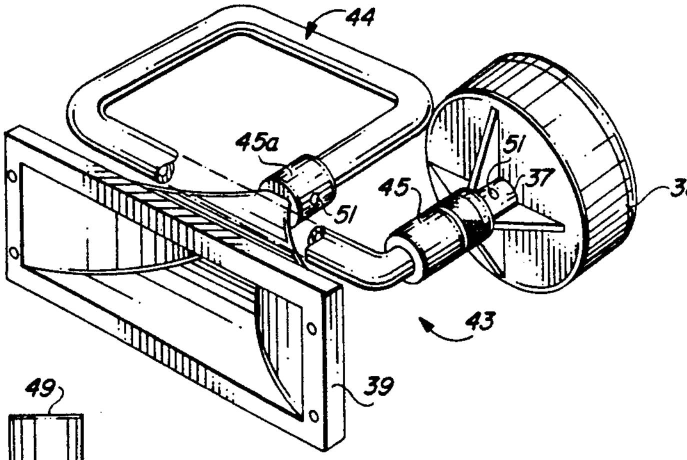
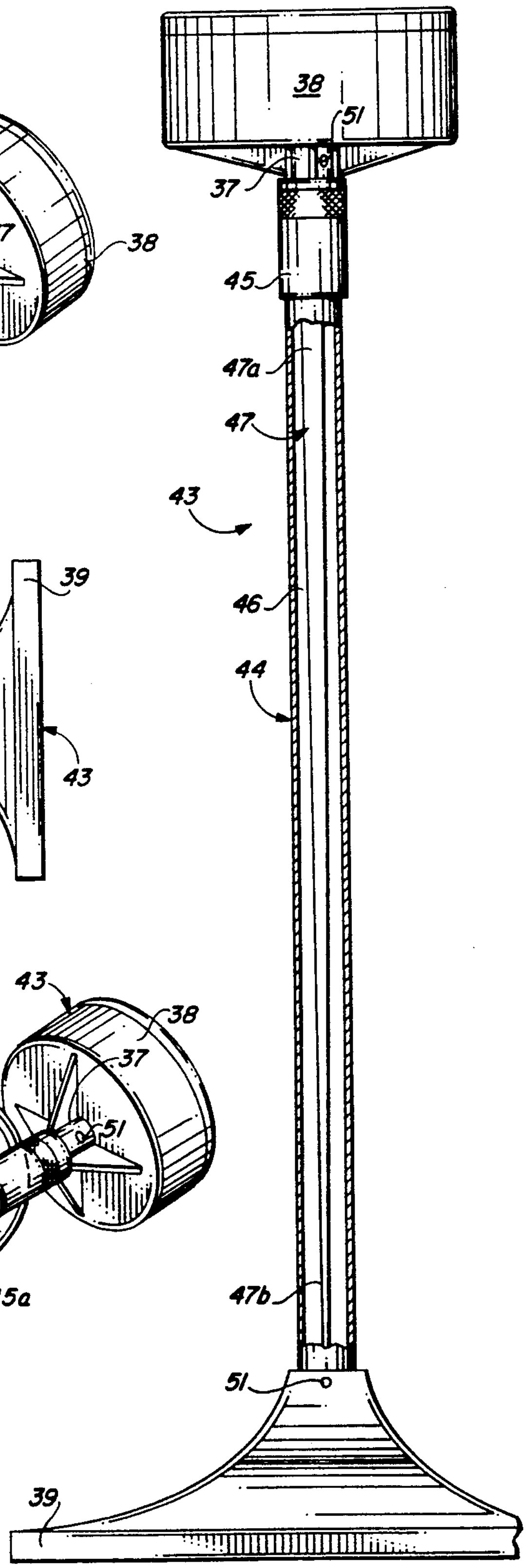
FIG. 2
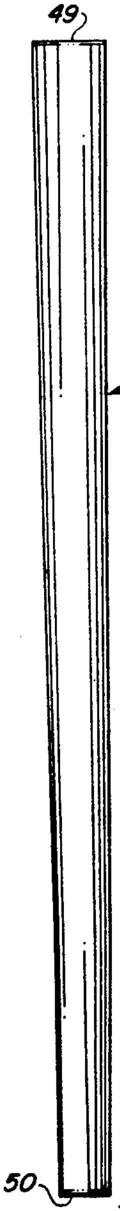
FIG. 3
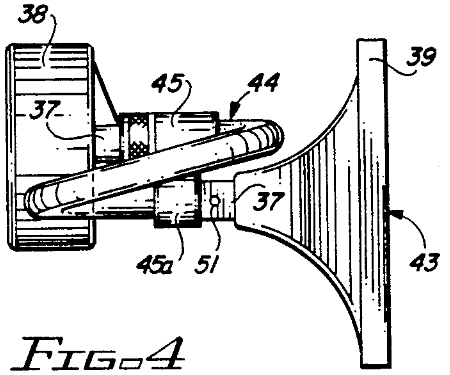
FIG. 4
FIG. 5
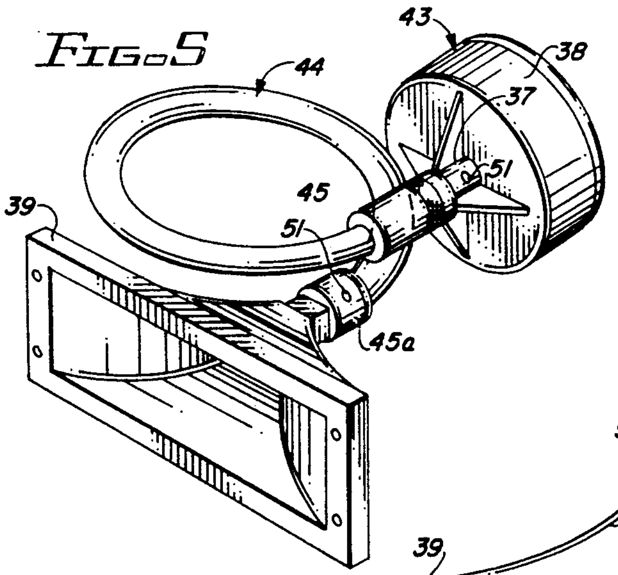

COILED EXPONENTIAL BASS/MIDRANGE/HIGH FREQUENCY HORN LOUDSPEAKER

BACKGROUND OF THE INVENTION

1. Field of the Invention

This invention relates to a loudspeaker device. More particularly, the present invention relates to "coiled" exponential bass/midrange/high frequency horn loudspeakers which are capable of reproducing a wider range of audio frequencies than prior art folded horns without the phase distortion associate with such horns, in a cabinet that is comparable in size and shape to any conventional direct radiator loudspeaker utilizing a driving unit or drive of similar size.

Low frequency sound waves or bass sounds can be reproduced by a variety of methods; however, only the exponential horn is capable of reproducing bass frequencies with "live" quality. That is to say, only an exponential horn is able to reproduce bass waves with sufficient acoustical power, life-like transient response and without the intermodulation distortion normally associated with direct radiator loudspeakers. Furthermore, the high frequency component of the coiled exponential bass/midrange/high frequency horn of this invention is connected to a corresponding driving unit by means of a coiled or contorted, time adjustable acoustic delay tube which includes an internal bore of constant or varying cross-sectional area, in order to delay the sound emitted from the high frequency horn and effect simultaneous exit of this sound with the sound emitted from the low frequency horn. The variance in the internal cross-sectional area of the coiled or contorted high frequency acoustic delay tube minimizes standing waves in the system, thereby enhancing performance and fidelity.

In a direct radiator loudspeaker system, bass frequencies are generally reproduced by the movement of a diaphragm mounted within a cabinet or enclosure, with the working side of the diaphragm exposed to the atmosphere. In order for the system to reproduce bass frequencies at an acceptacle sound pressure level, the diaphragm or cone must move large volumes of air. In accomplishing this objective, the diaphragm must traverse great distances in a short period of time, but in so doing, induces a great amount of intermodulation distortion. The higher the level at which the system is operated, the greater the intermodulation distortion realized, and with this distortion comes a significant loss of transient response, the resultant sound waves being of high pressure and low velocity. In contrast, a horn reproduces sound waves with high velocity and very low diaphragm motion, resulting in a high level of transient response and substantial elimination of intermodulation distortion. These characteristics afford the system the ability to reproduce sound waves with exacting emulation of the original sound.

2. Description of the Prior Art

Many bass horn loudspeakers are known in the prior art and among the most common are the "folded" variety, some of which are limited to location in the corner of a room for proper operation at bass frequencies. An example of a folded corner horn design is provided in U.S. Pat. No. 2,373,692, dated Apr. 17, 1945, to P. W. Klipsch. Although the acoustical performance of this type of folded horn is superior to a direct radiator-type bass loudspeaker, it lacks a great deal in the ability to effectively reproduce frequencies in the mid-range (approximately 400 to 2600 Hz). This problem is a direct result of folding, as the width of the horn at the folds determines the upper limit of the high frequency performance and the sound waves will not traverse a bend if the width of the bend is a half wavelength or more. The folding problem is further complicated by the fact that the horn taper is negative, wherein the flare rate is greater at the throat than at the mouth. Furthermore, the "folding" of a bass horn reduces the overall operational efficiency, as the exponential expansion rate cannot be maintained in the folds or transitions. Most folded bass horns will not effectively reproduce sound above about 500 Hz., thereby necessitating the use of a low upper limit cross-over point to a large mid-range horn.

In a complete folded bass horn loudspeaker system, the midrange horn must be rather large, in order to reproduce sound as low as the upper limit cutoff frequency of the bass horn, or driver. This combination results in a high level of acoustical phase distortion induced upon the electrical audio signal applied to the loudspeaker system, due to physical placement of the horns some distance apart. The problem is further complicated in this type of system by the fact that the larger midrange horns cannot reproduce the highest frequencies, thus necessitating the use of a third horn and thereby inducing further distortion of the applied audio signal phase. The original audio signal is split electrically and is coupled to each respective speaker horn, resulting in not one, but three sources of sound being projected into the listening area in three different planes. The resultant wound waves from each group of frequencies arrive at the listener's ear out of phase with each other. An example of severe acoustical phase distortion in a folded-type bass horn system is found in U.S. Pat. No. 2,871,972, filed Mar. 12, 1958, to C. Q. Glassey, wherein a single driver is used for driving two horn sections, one from the working side of the driver and the other from the non-working side, resulting in one horn being 180 degrees out of phase with the other.

Another problem with prior art folded bass horn systems is the large size and weight of such units, as compared to conventional direct radiator loudspeaker systems. Although it is accepted that folded bass horn systems are far superior regarding the fidelity of the sound reproduced, when compared with direct radiator loudspeakers, especially in the bass frequency range, they still remain large and costly, which probably accounts for the fact that folded bass horns are the least common of all types of loudspeakers.

A still further problem concerning the size of prior art folded-type bass horns is the fact that due to the large size and structure of these devices, their use as a sound-reproducing unit within a small device such as a portable audio player or television receiver, is not possible. Given the state of the art of modern sound-reproducing equipment such as the digital compact disc player and the digital amplifier, the use of direct radiator loudspeakers as an alternative in connection with such equipment would not be advantageous, as it would circumvent what is gained in the advanced audio technology, by acoustically distorting the audio signal.

Yet another problem associated with conventional folded horn systems is orchestration of the sound emitted from the respective bass, midrange and high frequency horns under circumstances where a folded horn of one frequency output is paired with one or more additional unfolded horns. The resulting time lag in sound emission causes distortion of the sound.

Other loudspeaker systems which utilize a folded or baffled configuration include the following: U.S. Pat. No. 75,617, dated Jun. 26, 1928, to H. L. Faison. The Faison loudspeaker includes a folded horn-type speaker of ornamental design. U.S. Pat. No. 2,058,132, dated Oct. 20, 1936, to F. Cirelli, details a "Sound Box for Amplifying Horns with Loudspeakers". The device includes a sound appliance having a sound box, two amplifying horns connected to the sound box and a loudspeaker provided within the midportion of the sound box. Two slender, abutting conical portions are provided in the sound box, each of which tapers convergently away from the abutment of the portions at a tapering angle which is less than 45 degrees with respect to the axis of the tapered portion in each of the portions, respectively, the horns being connected to the sound box at the smaller convergent ends thereof. A "Horn for a Loudspeaker" is detailed in U.S. Pat. No. 2,310,243, dated Feb. 9, 1943, to P. W. Klipsch. The horn detailed in this patent includes a multi-baffled loudspeaker designed for mounting in the corner of a room and provided with multiple compartments created by the internal baffles. U.S. Pat. No. 2,731,101, dated Jan. 17, 1956, also to P. W. Klipsch, details another "Loud Speaker". The loudspeaker detailed in this patent is designed such that the entire horn is formed outside of a housing and the housing itself is characterized by a simple acoustic low pass filter. The housing forms a simple cavity which is unobstructed except for immersion of the driver unit therein. An acoustic inertance, in the form of an orifice or slit suitably formed in the housing, coacts with the cavity to provide the low pass filter. The front panel of the housing has an opening therein and the driver unit is mounted in the cavity upon the front panel rearwardly of this opening, through which the treble sound radiation leaves the housing. The side panels of the housing extend convergingly rearwardly of the front panel to form, in conjunction with the external proximate surfaces, the horn portions of the speaker. A "Horn for a Loudspeaker" is detailed in U.S. Pat. No. 2,871,972, dated Feb. 3, 1959, to C. Q. Glassey. The Glassey horn includes a hollow housing having an aperture for establishing communication between the interior of the housing and the atmosphere; at least one vibrating diaphragm-type loudspeaker arranged within the housing; a chamber located within the housing and enclosing the speaker and having a first opening for establishment of communication between the rear side of the speaker diaphragm and the interior of the housing; and a second opening for establishing communication between the front side of the speaker diaphragm and the interior of the housing. Further included is a partition arranged within the housing for dividing the aperture into two continguous sections; a first horn substantially encircling the chamber and provided with a flare increasing in at least one dimension from the first opening to the aperture for directing the lower frequencies of the speaker from the first opening to one of the horn mouths; and a second horn having a flare increasing in at least the same dimension as the first horn from the second opening to the aperture, for directing the higher frequency of the speaker from the second opening to the other of the horn mouths, a portion of the first horn being arranged about the second horn, with the partition forming a portion common to each of the horns. U.S. Pat. No. 2,801,703, dated Aug. 6, 1957, to D. W. Martin, details a "Diffused-Tone Cabinet for Organs". The device includes a rectangular cabinet having front, rear and end walls; a top and a bottom; a first horn for low frequency sound production occupying a major portion of the enclosure volume of the cabinet and having its front and rear walls defined by the front and rear walls of the cabinet, with the mouth of tee first horn opening upwardly at the top of the cabinet, the top being acoustically transparent; and a second horn for high frequency sound production mounted within the cabinet and contained primarily within the body of the first horn, the second horn including a flat horn extending lengthwise of the cabinet and having an elongated, slot-like mouth opening upwardly at the top of the cabinet U.S. Pat. No. 3,944,747, dated Mar. 16, 1976, to Isukamoto, details a "High Fidelity Moving Coil Loudspeaker". The loudspeaker includes a tubular member having a length longer than the wavelength of any one of the frequencies in a desired frequency range and having a constant cross-sectional area along its entire length. Tubular members are coupled at one end with one side of a vibrating plate or diaphragm through an acoustical transformer constituted by a cavity formed therebetween, wherein the loudspeaker is capable of reproducing sounds with high fidelity, particularly in extremely low frequency ranges. A "Folded Horn Loudspeaker System" is detailed in U.S. Pat. No. 4,313,032, dated Jan. 26, 1982, to Donald W. Thomas, et al. The system includes a rigid enclosure and an integral, exponentially curved horn projecting outwardly from the enclosure toward the listening area. A transducer housed within a sealed chamber interiorly of the enclosure communicates through an aperture into a waveguide system of substantially rectangular dimensions. A baffle-plate system deflects sound energy from the waveguide into the throat of the horn. The baffle-plate system is positioned to avoid the reflection of sound waves back into the waveguide, to thereby minimize distortion. U.S. Pat. No. 4,549,631, dated Oct. 29, 1985, to Amar G. Bose, details a "Multiple Porting Loudspeaker System". The loudspeaker system includes an enclosure of rectangular cross-section, with a baffle dividing the interior into first and second subchambers. Each subchamber is provided with a port tube for coupling the subchamber to the region outside of the enclosure. The dividing baffle carries a woofer. U.S. Pat. No. 3,993,162, dated Nov. 23, 1976, to Kenneth Juite, details a speaker enclosure for a stereophone sound system, the speaker of which is enclosed in a chamber wherein the enclosure is connected to a long tube having a circular cross-section. The construction is such that phase inversion occurs and standing waves are suppressed. My U.S. Pat. No. 4,790,408, dated Dec. 13, 1988, details "Coiled Exponential Bass/Midrange Horn Loudspeakers" which are included in a preferred embodiment of this invention. Other patents of interest in the instant invention are as follows: U.S. Pat. No. 1,671,543, dated May 29, 1928; U.S. Pat. No. 1,722,220, dated Jul. 23, 1929; U.S. Pat. No. 1,737,102, dated Nov. 26, 1929; U.S. Pat. No. 1,761,568, dated Jun. 3, 1930; U.S. Pat. No. 1,763,381, dated Jun. 10, 1930, and U.S. Pat. No. 2,537,141, dated Jan. 9, 1951.

This invention solves problems associated with prior art folded-type bass horn loudspeaker systems having more than one driver and horn combinations by providing a "coiled" or convoluted bass and bass/midrange exponential horn loudspeaker system which demonstrates a significantly increased midrange sound output over prior art folded bass horns and a high frequency acoustically delayed horn designed to facilitate simultaneous projection of sound from the bass/midrange horn and the high frequency accoustically delayed horn. The system promotes this simultaneous sound projection by operation of a coiled or folded time adjustable acoustic delay line connecting the high frequency driver and the high frequency horn. The horns are oriented in the loudspeaker in such a manner that the dispersion angles of all horns overlap, thereby minimizing acoustical phase distortion in a complete loudspeaker system. The system can be provided in a size and shape which is comparable with common direct radiator loudspeaker systems utilizing driving units of similar size.

Accordingly, it is an object of this invention to provide coiled exponential bass/midrange/high frequency horn loudspeakers which exhibit significant bass, midrange and high frequency simultaneous sound output, thereby eliminating the necessity for utilizing a large midrange speaker or horn in a complete system.

Another object of this invention is to provide coiled exponential bass and bass/midrange/high frequency loudspeakers which utilize a miniaturized bass horn or driver in combination with a coiled horn section which is exponentially expanded and carefully convoluted so as not to disturb the cross-sectional configuration, and a high frequency horn connected to a corresponding driver by a coiled or folded, time adjustable acoustic delay line.

Yet another object of the invention is to provide coiled exponential bass/midrange/high frequency horn loudspeakers which, when used in combination with a small high frequency acoustically delayed speaker or horn of small size placed at the horn mouth and connected to a corresponding driver by means of a straight, coiled or folded, time adjustable acoustic delay line or tube, results in a complete loudspeaker system exhibiting a significantly reduced level of acoustical phase distortion and simultaneous sound projection from the base and/or midrange horn and the high frequency acoustically delayed horn.

It is a further object of the invention to provide coiled exponential bass/midrange/high frequency horn loudspeaker systems of varying dimension, which may employ low and high frequency driving units of any selected size and which are superior in sound quality to conventional loudspeakers, the low frequency drives of which are equipped with an exponentially-expanded horn section and the high frequency drivers fitted with a time adjustable acoustic delay line or tube having constant or varying cross-sectional area connected to a horn, to facilitate simultaneous projection of bass, midrange and high frequency sound from the loudspeaker systems.

A still further object of the invention is to provide a coiled exponential bass/midrange/high frequency horn loudspeaker system, in which the low frequency driving unit and the high frequency horn sections are separated by a selected distance and are connected by an exponentially expanding section or path of varying length and shape and wherein the high frequency horn section includes a time adjustable acoustically-delayed horn and driver connected by a coiled, folded or convoluted acoustic delay line to facilitate projection of sound simultaneously from the low frequency and high frequency horns, such that the sound appears to come from a single source.

Yet another object of the invention is to provide a coiled exponential bass/midrange/high frequency horn located within the cabinet of a selected device for reproducing sound, in which, to facilitate placement within the device, the bass/midrange driver section may be located at some distance from, but connected to the bass/midrange horn mouth, by an exponentially expanding section or interconnected sections of varying size and length which are coiled or tortuously laid out within the cabinet and the high frequency horn is separated from the corresponding high frequency driver by means of a coiled, folded or convoluted, time adjustable acoustic delay line of sufficient length to cause the high frequency sound to emerge or project from the speaker enclosure at the time of emergence or projection of the bass/midrange sound.

Another object of this invention is to provide coiled exponential bass and bass/midrange/high frequency loudspeaker systems in multiple arrangements, such as side-by-side, back-to-back, bottom-to-bottom, or in other combinations, for use in theaters, auditoriums and the like, for the purpose of increasing the sound pressure level which may be required for servicing such large areas and facilitating simultaneous sound emission from each high frequency, midrange and low frequency horn in each enclosure.

Yet another object of this invention is to provide a time delay horn loudspeaker which is characterized by an acoustically delayed high frequency driver and horn separated by a straight, coiled, folded or convoluted, time adjustable acoustic delay line or tube having a uniform or varying cross-sectional area, which acoustic delay line is of sufficient length to delay the high frequency sound waves and facilitate simultaneous projection of low and/or midrange frequency sound waves and the high frequency sound waves.

Still another object of the invention is to provide an acoustically delayed high frequency horn for mounting in an enclosure with a low frequency bass/midrange folded horn, which acoustically delayed high frequency horn includes a high frequency driver, a time adjustable acoustic delay tube having one end connected to the driver by means of a timing adjustment sleeve and a high frequency horn connected to the opposite end of the acoustic delay tube, wherein the acoustically delayed high frequency horn operates to effect simultaneous projection of sound from the high frequency horn and the bass/midrange folded horn.

SUMMARY OF THE INVENTION

These and other objects of the invention are provided in an exponential bass/midrange/high frequency horn loudspeaker having a bass and/or midrange horn and a high frequency, time adjustable acoustically delayed horn oriented in a cabinet characterized by a continuous coil or convolution or a series of spiral sound path sections or convolutions expanding exponentially and connected by planar surfaces. The loudspeaker is comparable in size and shape to that of a conventional direct radiator loudspeaker utilizing a driver or speaker of comparable size. The "coiled" or convoluted internal cabinet configuration affords a compact structure in which the horn length-to-cabinet height ratio is on the order of 2:1. The bass and/or midrange exponential horn element of this invention is characterized by a cross-sectional area which increases exponentially in size by a certain percentage for each inch of distance from the throat. The cross-sectional area can be therefore expressed by the exponential function detailed in my U.S. Pat. No. 4,790,408. The high frequency acoustically delayed horn includes a high frequency driver and horn connected by a straight, coiled, folded or convoluted acoustic delay line having a timing adjustment sleeve and is fitted in the top area of the cabinet. The length of the acoustic delay line is chosen such that sound waves from the high frequency driver reach the corresponding high frequency horn at the same time that sound waves from the bass and/or midrange driver reach the exit opening in the bass and/or midrange exponential horn, to facilitate simultaneous sound projection from the cabinet. The high frequency acoustically delayed horn component may also be installed in other cabinets which utilize additional low and/or midrange frequency horns.

BRIEF DESCRIPTION OF THE DRAWINGS

The invention will be better understood by reference to the accompanying drawings wherein:

FIG. 1 is a perspective view of the high frequency acoustically delayed horn component of the coiled exponential bass/midrange/high frequency horn loudspeaker of this invention;

FIG. 2 is a front view, partially in section, an alternative embodiment of the high frequency acoustically delay horn component illustrated in FIG. 1;

FIG. 3 is a side view of an alternative tapered acoustic delay tube for the high frequency acoustically delayed horn component illustrated in FIG. 2;

FIG. 4 is a side view of the high frequency acoustically delayed horn component illustrated in FIG. 1;

FIG. 5 is a perspective view of an alternative preferred configuration of the high frequency acoustically delayed horn component illustrated in FIGS. 1 and 4;

DESCRIPTION OF THE PREFERRED EMBODIMENTS

Figure 6:
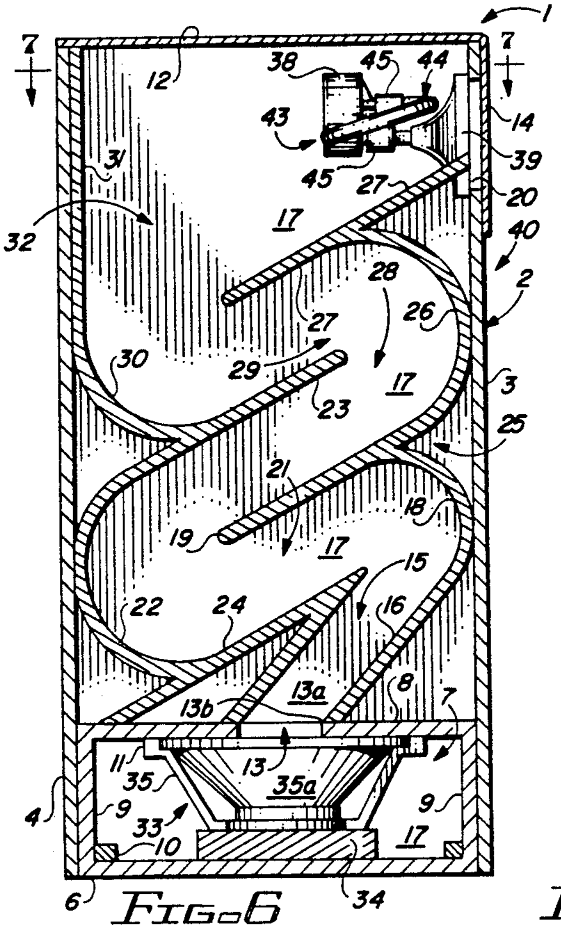
FIG. 6 is a front sectional view of a preferred embodiment of the coiled exponential bass/midrange/high frequency horn loudspeaker of this invention.
Figure 7:
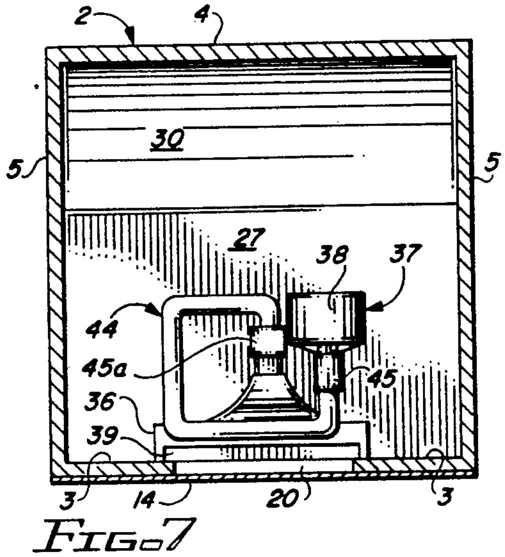
FIG. 7 is a sectional view taken along line 6—6 of the coiled exponential bass/midrange/high frequency horn loudspeaker illustrated in FIG. 6.
Figure 8:
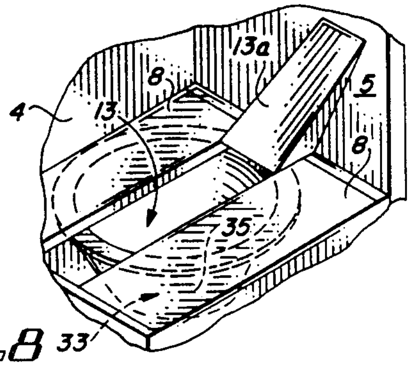
FIG. 8 is a perspective view, partially in section, of the internal loading aperture and aperture wedge elements in the loudspeaker cabinet.

Referring initially to FIGS. 6–8 of the drawings, in a first preferred embodiment of the invention a low frequency coiled bass/midrange/high frequency exponential horn loudspeaker is generally illustrated by reference numeral 1. The low frequency coiled bass/midrange/high frequency exponential horn loudspeaker 1 is detailed in my U.S. Pat. No. 4,790,408 and is characterized by a box-like cabinet 2 having a front panel 3, a corresponding parallel rear panel 4, spaced by side panels 5 and closed at the bottom by a bottom panel 6, as illustrated. A sealed air chamber 7 is provided in the lower portion of the cabinet 2 and is defined by an air chamber cover 8, spaced from the bottom panel 6 and fitted with a pair of spaced air chamber sides 9, which extend parallel to and lie adjacent to the bottom portion of the front panel 3 and the rear panel 4, respectively. A pair of mount blocks 10 are designed to secure the air chamber sides 9 to the bottom panel 6 by means of screws or other fasteners (not illustrated), according to the knowledge of those skilled in the art. A pair of L-shaped speaker mount brackets 11 are secured to the air chamber cover 8 in spaced relationship, in order to engage the top flange of the low frequency driver frame 35 of a low frequency driver 33 and securely mount the low frequency driver 33 in the sealed air chamber 7. When so mounted, the driver cone **35*a* of the low frequency driver 33 faces upwardly toward a loading aperture 13, provided in the air chamber cover 8, with the low frequency magnetic assembly 34 of the low frequency driver 33 lying flat against the inside surface of the bottom panel 6, as illustrated. The length and width of the horn throat 13*b* and the adjacent loading aperture 13 are determined by the width and base length of a pair of aperture wedges 13*a*, one of which is illustrated in FIG. 8, attached to the side panels 5 and the air chamber cover 8. The spaced speaker mount brackets 11 serve to secure the low frequency driver 33 in the sealed air chamber 7 beneath the horn throat 13*b* and the loading aperture 13. The remainder of the interior of the cabinet 2 defines the sound travel area and horn of the low frequency driver 33 component of the coiled exponential bass/midrange/high frequency horn loudspeaker 1 system, in terms of a tortuous or convoluted path for travel of the sound emitted by the low frequency driver 33. This sound path through the cabinet 2 begins at the horn throat 13*b* and extends into the loading aperture 13, located in a bottom passage 15, which is defined by a frontal bottom passage wall 16 and a companion rear bottom passage wall 17. The bottom passage 15 extends thusly upwardly between the non-parallel aperture wedges 13*a*, which project in narrowing forward and upward tapered, angular relationship from a wide base at the loading aperture 13 in the air chamber cover 8, to a narrow edge at the first spiral section 18, as further illustrated in FIG. 8. The flat, straight frontal bottom passage wall 16 further defines the curved first spiral section 18 at the top thereof, which first spiral section 18 extends between the side panels 5 and terminates in a flat, straight, rearwardly and downwardly-extending first spiral section wall 19. The opposite, flat and straight rear bottom passage wall 17 extends between the side panels 5, flaring exponentially with respect to the frontal bottom passage wall 16 and terminates at the extending end of a rearwardly disposed rearward passage wall 24. The rearward passage wall 24 is spaced from the first spiral section wall 19 and in combination with the first spiral section wall 19 and the side panels 5, defines an exponentially flared first rearward passage 21, which communicates in convoluted fashion with the bottom passage 15. The rearward passage wall 24 receives one end of a curved second spiral section 22, which in turn, extends between the side panels 5 and terminates in a flat, straight second spiral section wall 23, that extends forwardly and upwardly inside the cabinet 2 between the side panels 5. The second spiral section wall 23 is spaced from the first spiral section wall 19 in exponentially flared relationship to define a first forward passage 28, extending between the parallel side panels 5 and located immediately above, and communicating with, the first rearward passage 21 and separated therefrom by the first spiral section wall 19, as illustrated in FIG. 1. The first spiral section wall 19** terminates at one end in a curved, third spiral section 26, which extends between the side panels 5 and terminates rearwardly in a flat and straight third spiral section wall 27, which also extends between the side panels 5. The second spiral section wall 23 is spaced from the third spiral section wall 27 between the side panels 5 in an exponentially flared configuration to define a second rearward passage 29, which communicates with the adjacent first forward passage 28. A fourth spiral section 30 extends between the side panels 5 and joins a fourth spiral section wall 31, projecting parallel to and lying adjacent the rear panel 4 and the second spiral section wall 23. An outlet chamber 32 is defined by the third spiral section wall 27, the fourth spiral section wall 31 and the parallel side panels 5, respectively.

A high frequency acoustically delayed horn 43 is mounted in the outlet chamber 32, located in the top portion of the cabinet 2, with the high frequency horn 39 of the acoustically delayed horn 43 extending through a slot 36, provided in the forward portion of the third spiral section wall 27, and pressed against the front panel 3, as illustrated in FIGS. 6 and 7. The high frequency driver 38 is connected to the high frequency horn 39 by means of a coiled acoustic delay tube 44 and a timing adjustment sleeve 45 and collar 45*a*, and as further illustrated in FIG. 7. The front portion of the high frequency horn 39 extends over a front panel opening 20, provided in the front panel 3 of the cabinet 2 and a segment of side grill cloth 14 extends over the front panel opening 20, in order to obscure the high frequency horn 39 and impart a finished appearance to the cabinet 2. Furthermore, in a most preferred embodiment of the invention, a top grill cloth 12 extends over the top of the cabinet 2, in order to further finish the cabinet 2.

Figure 9:
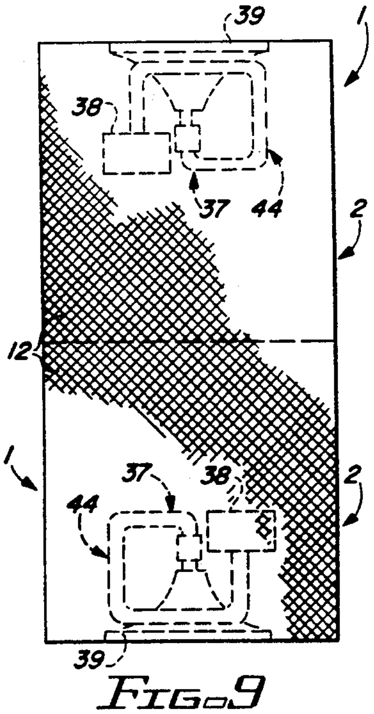
FIG. 9 is a top view of a first preferred spacial orientation for a pair of the coiled exponential bass/midrange/high frequency horn loudspeakers of this invention.
Figure 10:
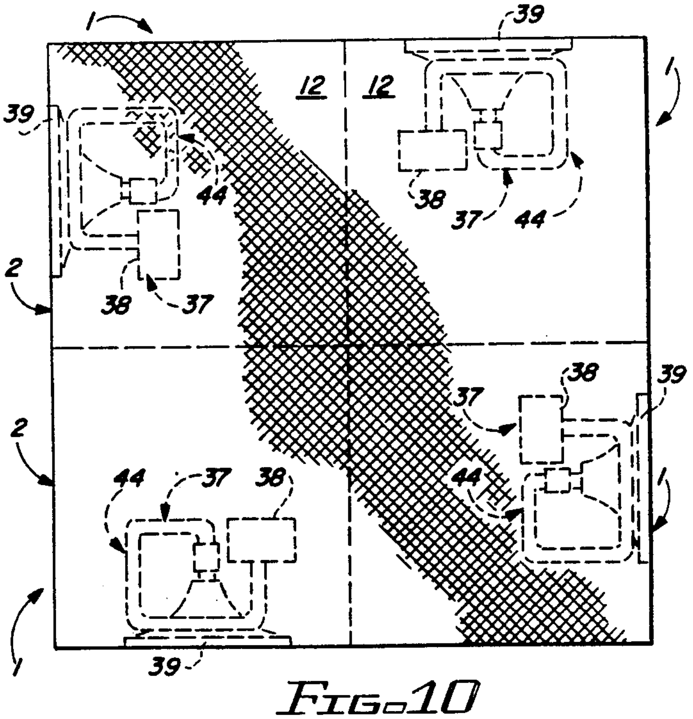
FIG. 10 is a top view of a second preferred spacial orientation for four of the coiled exponential bass/midrange/high frequency horn loudspeakers.

Referring now to FIGS. 1-5 and 7 of the drawings, as heretofore described, in a preferred embodiment of the invention the acoustic delay tube 44 of the high frequency acoustically delayed horn 43 is secured to the high frequency horn 39 and the high frequency driver unit 38 by means of a coupling 45*a* and a timing adjustment sleeve 45, respectively. The acoustic delay tube 44 is hollow and may be straight, as illustrated in FIG. 2, depending upon the shape and size of the cabinet in which it is mounted. Alternatively, the acoustic delay tube 44 may be coiled or convoluted, as illustrated in FIGS. 1, 4, 5 and 7 to fit in the cabinet 2. The acoustic delay tube 44 tapered, as illustrated in FIG. 9, in order to provide a tapered interior bore to prevent the formation of standing waves in the acoustic delay tube 44. Referring to FIG. 2, this objective is realized in the straight acoustic delay tube 44 having a tube bore 46 of uniform cross-sectional area, by inserting a tapered internal area adjusting member 47 in the tube bore 46. The large end 47*a* of the tapered internal area adjusting member 47 extends through the timing adjustment sleeve 45 and is secured to the driver nipple 37, which adjustably receives the timing adjustment sleeve 45, by means of a retaining pin 51. The opposite, or small end 47*b* of the internal area adjusting member 47 is secured to the high frequency horn 39 by means of a second retaining pin 51, as illustrated in FIG. 2, or to the collar 45*a*, as illustrated in FIGS. 1 and 3-5. In a most preferred embodiment of the invention the internal area adjusting member 47 is constructed of a flexible material such as rubber, for mounting in the coiled acoustic delay tube 44 illustrated in FIGS. 1, 4 and 5.

As further illustrated in FIGS. 1, 2, 4 and 5, it will be appreciated that the timing adjustment sleeve 45 is slidably mounted on the driver nipple 37 and the acoustic delay tube 44, in order to finely adjust the travel time of the sound projecting from the high frequency driver 38 in the acoustic delay tube 44 to the high frequency horn 39. The timing adjustment sleeve 45 may either be tightly and slidably attached to either the driver nipple 37, or slidably adjusted into the desired sound travel time position and glued or otherwise secured into that position, as desired.

The size and shape chosen for the cabinet 2 of the preferred embodiments of the invention set forth in the drawings, demonstrates the ability of the coiled exponential bass/midrange/high frequency horn loudspeaker 1 to reproduce low and high base frequencies in phase with high tweeter frequencies from a cabinet 2 of relatively small size. However, it will be appreciated by those skilled in the art that it is possible to produce a coiled exponential bass/midrange/high frequency horn loudspeaker 1 of substantially any desired size. For example, a miniature coiled exponential bass/midrange/high frequency horn loudspeaker 1 can be constructed utilizing a low frequency driver 33 and a high frequency driver 38 as small as 4 inches in diameter. Alternatively, a much larger coiled exponential bass/-midrange/high frequency horn loudspeaker 1 can be developed for a subwoofer system, such as those used in theaters or auditoriums, utilizing a low frequency driver 33 and high frequency driver 38 having selected diameters.

Referring again to FIGS. 6 and 7 of the drawings, a low frequency driver 33 having a diameter of 8 inches is typically used in the cabinet 2 of the coiled exponential bass/midrange/high frequency horn loudspeaker 1. Although the high frequency driver 38 in the acoustically delayed horn 43 illustrated in these figures is smaller than the low frequency driver 33, it will be appreciated that these components may be equal or dissimilar in size, as desired. As further illustrated in to FIGS. 6 and 7, the length of the sound travel path through the sound passage chamber 25 in the coiled exponential bass/midrange/high frequency horn loudspeaker 1 is determined by the desired dimensions of the enclosure or cabinet 2. This dimension, in turn, determines the length of the acoustic delay tube 44, in order to match the timing of sound output originating in the low frequency driver 33 and high frequency driver 38.

Accordingly, in a most preferred embodiment of the invention the high frequency acoustically delayed horn 43 is added to the cabinet 2 in combination with the low frequency driver 33, in order to extend the audio range of the system toward the upper limit of the audio spectrum. Considering the high midrange output of the coiled exponential bass/midrange/high frequency horn loudspeaker 1, the necessity for a large midrange horn in the cabinet 2 is eliminated. Accordingly, addition of the high frequency acoustically delayed horn 43 to the cabinet 2 in the coiled exponential bass/midrange/high frequency horn loudspeaker 1 balances the system and eliminates the necessity of providing a midrange horn. In a most preferred embodiment of the invention, the high frequency acoustically delayed horn 43 is installed in the outlet chamber 32 of the cabinet 2 in the slot 36, provided in the third spiral section wall 27, as heretofore described. By locating the acoustically delayed horn 43 in this position inside the cabinet 2, the dispersion angles of both the acoustically delayed horn 43 and the low frequency driver 33 overlap each other, forming a common axis for both speakers. Accordingly, the combination results in a smooth frequency response curve as detailed in my U.S. Pat. No. 4,790,408, with a smooth transition point for crossover, coupled with the common axis. All frequencies reproduced by the low frequency driver 33 and the high frequency acoustically delayed horn 43 appear to originate from a single source and the sound is projected from the cabinet 2 at the same time, resulting in a loudspeaker system which exhibits a substantially reduced level of acoustical phase distortion as compared to both prior art horn and direct radiator loudspeaker systems.

For commercial applications such as in theaters and auditoriums, it may be necessary to provide the coiled exponential bass/midrange/high frequency horn loudspeaker 1 in pairs or groups of pairs, to increase the acoustical power level in these large areas. Considering the point of discharge at the top grill cloth 12 and in the case of the coiled exponential bass/midrange/high frequency horn loudspeaker 1, the side grill cloth 14, placement of the cabinets 2 in a side-by-side and back-to-back arrangement affords a practical spatial arrangement for increasing acoustical power level output, as illustrated in FIGS. 8 and 9 of the drawings. Furthermore, the coiled exponential bass/midrange/high frequency horn loudspeaker 1 may be suspended from a ceiling (not illustrated) for servicing large areas such as an arena, auditorium or domed stadium, and similar locations. Referring again to FIGS. 6 and 7 of the drawings, the high frequency horn 39 of the high frequency acoustically delayed horn 43 can be oriented adjacent to either of the side panels 5 or the rear panel 4, or anywhere in the outlet chamber 32, as desired, the position noted in the drawings being illustrative only.

It will be appreciated that the particular dimensions incorporated in the cabinet 2 of the coiled exponential bass/midrange/high frequency horn loudspeaker 1 of this invention are for illustrative purposes only and in no way limit the scope of the invention. The coiled or convoluted design and length of the exponentially flared sound passage chamber 25 in the respective cabinets 2 affords an extremely efficient and rigid structure created by multiple baffled surfaces within the cabinet 2, which baffled surfaces define the sound passage chamber 25. This exponentially expanding sound passage chamber 25 results in a cancellation of cabinet resonances, which facilitates the use of lighter materials with a more complete air tightness, all of which are essential for proper and efficient operation of the coiled exponential horn loudspeakers detailed herein. It is further understood that the sound passage chamber 25 can be constructed of any desired material, according to the knowledge of those skilled in the art. For example, the sound passage chamber 25 can be constructed of suitable plastic materials such as polyethylene and polypropylene, in non-exclusive particular, by well known injection-molding techniques and installed in a cabinet of desired dimensions and design.

Referring again to FIGS. 1–5 of the drawings, it will be appreciated by those skilled in the art that the high frequency acoustically delayed horn 43 can be placed in a cabinet or enclosure of desired dimensions with another folded horn, and the length of the acoustic delay tube 44 chosen to facilitate simultaneous production of sound from the two horns. For example, the high frequency acoustically delayed horn 43 may be installed in the cabinet of the Klipsch folded horn illustrated and detailed in U.S. Pat. No. 2,373,692 dated Apr. 17, 1945, for the purpose described above. Macro adjustment of the sound travel time is effected by choosing an acoustic delay tube 44 of selected length and micro adjustment of the sound travel time is achieved by adjustment of the timing adjustment sleeve 45, as described above.

Accordingly, while the preferred embodiments of the invention have been described above, it will be recognized and understood that various modifications may be made therein and the appended claims are intended to cover all such modifications which may fall within the spirit and scope of the invention.

Having described my invention with the particularity set forth above, what is claimed is:

1. A coiled exponential bass/midrange/high frequency horn loudspeaker comprising an enclosure having a bottom panel, side panels upward-standing from said bottom panel in spaced relationship, a front panel upward-standing from said bottom panel for closing one side of said side panels and a rear panel upward-standing from said bottom panel for closing the opposite side of said side panels and defining an open top; a flared sound chamber provided in said enclosure with said side panels defining opposite walls of said flared sound chamber and said flared sound chamber arranged in convoluted, stacked relationship and extending through said enclosure in exponentially expanding relationship; a substantially sealed air chamber provided in said enclosure adjacent to said bottom panel and a loading aperture provide in said air chamber, said air chamber communicating with the bottom end of said flared sound chamber through said loading aperture; a low frequency driver mounted in said air chamber adjacent to said loading aperture, for generating sound and projecting the sound through said loading aperture and said flared sound chamber and from said open top of said enclosure; a high frequency horn mounted in said enclosure adjacent to said open top; an acoustic delay tube located in said enclosure, with one end of said acoustic delay tube attached to said high frequency horn; timing adjustment sleeve means slidably carried by said acoustic delay tube for finely adjusting the delay of said high frequency sound; and a high frequency driver attached to the opposite end of said acoustic delay tube, and wherein the cross-sectional area of said acoustic delay tube varies from a smaller area at said high frequency drive to a larger area at said high frequency horn, whereby high frequency sound generated by said high frequency driver is delayed in said acoustic delay tube to project from said enclosure substantially simultaneously with the sound of lower frequency generated by said low frequency horn and projecting from said open top.

2. The coiled exponential bass/midrange/high frequency horn loudspeaker of claim 1 further comprising a sound-penetrating top cover covering said open top of said enclosure and a sound-penetrating front cover covering said slot in said front panel.

3. The coiled exponential bass/midrange/high frequency horn loudspeaker of claim 2 wherein said flared sound chamber further comprises a plurality of connected, individually flared sound chambers, with the first one of said flared sound chambers located adjacent to said loading aperture and said low frequency driver and the last one of said flared sound chambers communicating with said high frequency horn and said open top.

4. A time delay horn for adjusting the travel time of sound waves, comprising driver means, a tube and a timing adjustment sleeve adjustably provided on said tube in length-adjusting relationship, said tube having one end connected to said driver means and horn means connected to the opposite end of said tube, whereby the travel time of the sound waves is proportional to the length of said tube.

5. The time delay horn of claim 4 wherein said tube is tapered for varying the inside cross-sectional area of said tube.

6. The time delay horn of claim 4 further comprising elongated, tapered strip means provided in said tube for varying the cross-sectional area of said tube.

7. The time delay horn of claim 4 wherein said tube is coiled.

8. The time delay horn of claim 7 wherein said tube is tapered for varying the inside cross-sectional area of said tube.

9. The time delay horn of claim 7 further comprising elongated, flexible, tapered strip means for varying the inside cross-sectional area of said tube.

* * * * *